United States Patent
Meunier-Beillard et al.

(10) Patent No.: US 7,605,060 B2
(45) Date of Patent: Oct. 20, 2009

(54) METHOD OF EPITAXIAL DEOPOSITION OF AN N-DOPED SILICON LAYER

(75) Inventors: Philippe Meunier-Beillard, Eindhoven (NL); Mathieu Rosa Jozef Caymax, Leuven (BE)

(73) Assignee: NXP B.V., Eindhoven (NL)

( * ) Notice: Subject to any disclaimer, the term of this patent is extended or adjusted under 35 U.S.C. 154(b) by 387 days.

(21) Appl. No.: 10/550,853

(22) PCT Filed: Mar. 25, 2004

(86) PCT No.: PCT/IB2004/050333

§ 371 (c)(1),
(2), (4) Date: Sep. 22, 2005

(87) PCT Pub. No.: WO2004/086472

PCT Pub. Date: Oct. 7, 2004

(65) Prior Publication Data

US 2006/0205185 A1 Sep. 14, 2006

(30) Foreign Application Priority Data

Mar. 28, 2003 (EP) .................................. 03100821

(51) Int. Cl.
*H01L 21/20* (2006.01)
(52) U.S. Cl. ................ 438/478; 438/481; 257/E21.102; 257/E21.106
(58) Field of Classification Search .................. 438/222, 438/478, 479, 481, 507, 300; 257/E21.106, 257/E21.102; 118/715
See application file for complete search history.

(56) References Cited

U.S. PATENT DOCUMENTS 4,642,227 A * 2/1987 Flagan et al. ................ 423/349
5,378,651 A 1/1995 Agnello et al.
6,184,154 B1 * 2/2001 Dietze et al. ................. 438/762
6,251,188 B1 6/2001 Okubo et al.
6,391,749 B1 * 5/2002 Park et al. .................... 438/478

(Continued)

FOREIGN PATENT DOCUMENTS

EP 0 459 122 12/1991
EP 0459122 A2 12/1991

OTHER PUBLICATIONS

Alonso J C: "Low-Temperature Epitaxial Growth of Undoped and N-Doped Silicon by Photochemical Vapor Deposition Using SIH4/SIH2/H2/PH3 Mixtures" Thin Solid Filsm, Elsevier-Sequoia S.A. Lausanne, CH, vol. 327, No. 1/2, 1994, pp. 98-104.

(Continued)

*Primary Examiner*—Khiem D Nguyen

(57) ABSTRACT

The invention relates to a method of manufacturing a semiconductor device (10) with a semiconductor body (1) comprising silicon is provided with an n-type doped semiconductor region (2) comprising silicon by means of an epitaxial deposition process, wherein the epitaxial deposition process of the n-type region is performed by positioning the semiconductor body (1) in an epitaxial reactor and introducing in the reactor a first gas stream comprising a carrier gas and further gas streams comprising a gaseous compound comprising silicon and a gaseous compound comprising an element from the fifth column of the periodic system of elements, while heating the semiconductor body (1) to a growth temperature (Tg) and using an inert gas as the carrier gas. According to the invention for the gaseous compound comprising silicon a mixture is chosen of a first gaseous silicon compound which is free of chlorine and a second gaseous silicon compound comprising chlorine. Such a method allows for a very high carrier concentration in the in-situ doped grown region (3). Nitrogen is the preferred carrier gas.

20 Claims, 6 Drawing Sheets

U.S. PATENT DOCUMENTS

Figure 1:
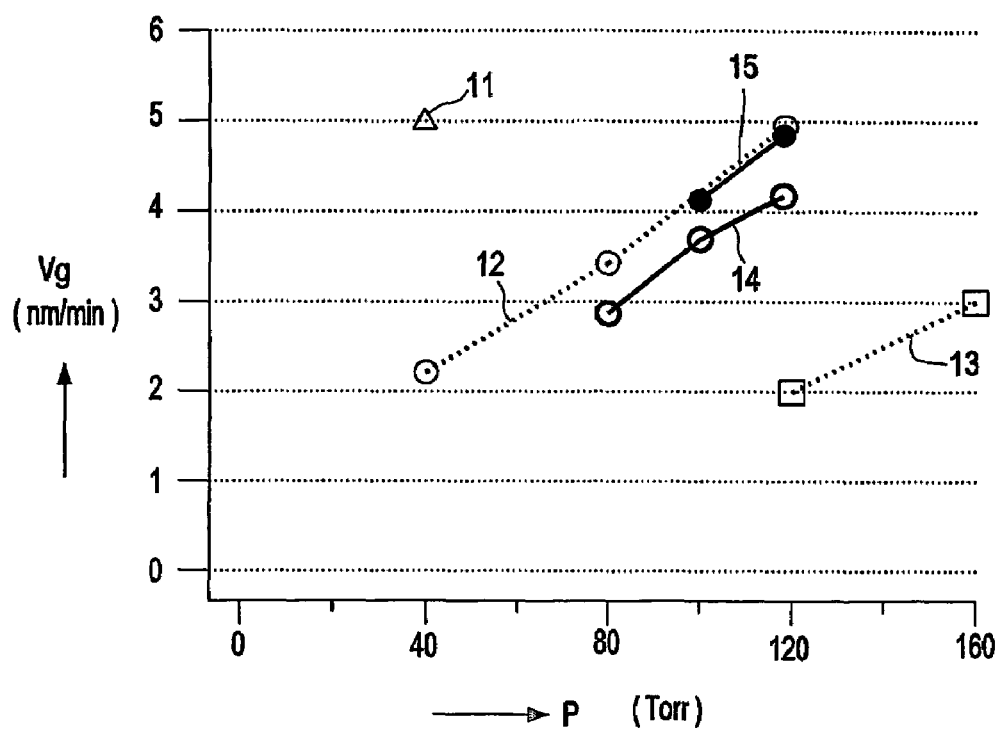

| | | | |
|---|---|---|---|
| 6,395,621 | B1 * | 5/2002 | Mizushima et al. ......... 438/486 |
| 7,101,774 | B2 * | 9/2006 | Nagasawa et al. ........... 438/478 |
| 7,166,528 | B2 * | 1/2007 | Kim et al. ................... 438/607 |
| 7,312,128 | B2 * | 12/2007 | Kim et al. ................... 438/300 |
| 2003/0003646 | A1 | 1/2003 | De Boer |

OTHER PUBLICATIONS

Agnello, P.D., et al; "Heavy Arsenic Doping of Silicon Grown by Atmospheric-Pressure Chemical Vapor Deposition at Low Temperatures"; Appl. Phys. Lett. 60 (4); Jan. 27, 1992; pp. 454-456.

Agnello, P.D., et al; "Silicon Epitaxy From Silane by Atmospheric-Pressure Chemical Vapor Deposition at Low Temperatures"; Appl. Phys. Lett. 61 (11); Sep. 14, 1992; pp. 1298-1300.

Yang, Min, et al; "Phosphorus Doping and Sharp Profiles in Silicon and Silicon-Germanium Epitaxy by Rapid Thermal Chemical Vapor Deposition"; Journal of the Electrochemical Society, 147 (9); pp. 3541-3545; Jun. 2, 2000.

Sedgwick, T.O., et al; "High Phosphorus Doping of Epitaxial Silicon at Low Temperature and Atmospheric Pressure";Appl. Phys. Letter. 58 (17); Apr. 29, 1991; pp. 1896-1898.

Alonso, J.C., et al; "Low-Temperature Epitaxial Growth of Undoped and N-Doped Silicon by Photochemical Vapor Using Deposition SIH4/SIH2CL2/H2/PH3 Mixtures"; Elsvier Sequoia S.A. Lausanee, CH, vol. 327, No. 1/2, 1994; pp. 98-104.

* cited by examiner

METHOD OF EPITAXIAL DEOPOSITION OF AN N-DOPED SILICON LAYER

The invention relates to a method of manufacturing a semiconductor device with a semiconductor body comprising silicon which is provided with an n-type doped semiconductor region comprising silicon by means of an epitaxial deposition process, wherein the epitaxial deposition process of the n-type region is performed by positioning the semiconductor body in an epitaxial reactor and introducing in the reactor a first gas stream comprising a carrier gas and further gas streams comprising a gaseous compound comprising silicon and a gaseous compound comprising an element from the fifth column of the periodic system of elements, while heating the semiconductor body to a growth temperature and using an inert gas as the carrier gas. With such a method with in situ doped epitaxy it is envisaged to manufacture semiconductor devices with a n-type semiconductor region with a very high concentration and very steep carrier concentration profile. Drawbacks like channeling, ion-induced damage and diffusion during post annealing, which are inherent to an alternative technique like ion implantation are avoided. The invention also relates to a semiconductor device obtained with such a method and an apparatus for performing such a method.

A method as mentioned in the opening paragraph is known from "Silicon epitaxy from silane by atmospheric-pressure chemical vapor deposition at low temperature" by P. D. Agnello et. al. which was published in Appl. Phys. Lett. 61 (11), 14 Sep. 1992, pp. 1298-1300. An in situ doped epitaxial deposition process at atmospheric pressure is described using Helium as a carrier gas. Doping is provided with the use of a gas stream of a gaseous compound of a V-element, in this case $PH_3$. Growth is performed using as the silicon source a gas stream of a gaseous compound of silicon, in this case $SiH_4$. The results obtained are compared with similar experiment but with $H_2$ as the carrier gas and $SiH_2Ch_2$ (=Dichlorosilane or DCS for short) as the gaseous silicon source.

A drawback of such a method is that the phosphor profile obtained is not sufficiently high and steep and the crystalline quality of in particular the region grown with $SiH_4$ is reported to be degraded and the growth rate to be retarded while obtaining heavy doping.

It is therefore an object of the present invention to avoid the above drawbacks and to provide a method which results in a very high and steep doping profile of an in situ doped epitaxial semiconductor region and at the same time allowing for a good crystalline quality of the region formed and for a relatively high growth rate.

To achieve this, a method of the type described in the opening paragraph is characterized in accordance with the invention in that for the gaseous compound comprising silicon a mixture is chosen of a first gaseous silicon compound which is free of chlorine and a second gaseous silicon compound comprising chlorine. With the method according to the invention not only a very high doping concentration was obtained with a very steep profile but also the crystalline quality of the material appeared to be good enough to manufacture practical devices. Also a very practical growth rate was obtained. Surprisingly, the combination of a gaseous silicon source which is free of chlorine and a gaseous silicon source which comprises chlorine allows to reach all the aims envisaged. Very satisfactory results were obtained with a mixture of silane and dichlorosilane while for the carrier gas nitrogen was chosen and growth was performed at reduced pressure and at a relatively low temperature.

In a preferred embodiment of a method according to the invention thus silane is chosen for the first gaseous silicon compound and for the second gaseous silicon compound dichlorosilane is chosen. Preferably, phosphine is chosen for the gaseous compound comprising a V-element. Best results were obtained at a growth temperature in the range between 500° C. and 600° C. The—reduced—operating pressure is preferably chosen in the range between 120 and 160 Torr.

The method according to the invention is particularly suitable for forming the source and drain region of an (n-channel) MOSFET (=Metal Oxide Semiconductor Field Effect Transistor).

In a very favorable embodiment of a method according to the invention after the growth of the n-type semiconductor region comprising silicon the deposition process is continued with the growth of a further semiconductor region comprising a lower n-type doping than the semiconductor region or a p-type doping and in that at least between the growth of the semiconductor region and the growth of the further semiconductor region, the carrier gas of the inert gas is replaced by a carrier gas comprising hydrogen. It has been found that although the majority of relevant properties is optimal when an inert carrier gas like nitrogen is used, the steepness of the V-element profile, e.g. the phosphor profile, is even better if the carrier gas is temporarily switched to hydrogen.

Preferably said switching process involves a cycle of three periods: a first short period in which the carrier gas of an inert gas is maintained, a second short period in which the carrier gas is replaced by hydrogen and a third short period in which the carrier gas is switched back to the inert gas in which the deposition process is continued but without the presence of the gaseous compound of the V-element. Short in this respect means a time lying between e.g. 1 sec and 30 sec.

It appeared that even better results are obtainable if said cycle is repeated a number of times. Improvement, i.e. a lower shoulder on the phosphor concentration profile, is still observed after a repetition of three times the above cycle. During the deposition of the further semiconductor region, the gas stream of the gaseous compound with the V-element is preferably chosen to be zero and replaced by another gas stream comprising a gaseous compound comprising an element of the third column of the periodic system of the elements, resulting in a device comprising a p-type further semiconductor region on top of the n-type semiconductor region. In this way pn junctions of e.g. a diode or of a part of a (bipolar) transistor may be grown.

In this respect, the method according to the above embodiment is very suitable for making pnp bipolar transistors of which the n-type base region is formed by the n-type semiconductor region and the p-type emitter region is formed by the further semiconductor region. A very steep junction between base and emitter of such a transistor, together with a very high doped emitter, results in superior properties of such a transistor like a better cut off frequency in a pnp transistor comprising a thin undoped region between the base and the emitter. The invention also involves advantages in the manufacturing of a npn transistor, in which now a monokristallijne emitter may be grown in stead an often used polycrystalline emitter. The former allows for a reduction of the emitter resistance and improvement of high frequency behavior. From the above it is clear that a method according to the invention may be applied with advantage in a BI(C)MOS (=BIpolar (Complementary) Metal Oxide Semiconductor) process.

The method according to the invention is also very suitable for forming layer structures comprising a mixed crystal of silicon and germanium. In that case a gaseous compound of germanium, like Germane ($GeH_4$), is introduced into the reactor during growth. Germanium is increasingly introduced in one or more layers of both bipolar transistors or MOSFETs.

The invention comprises also a semiconductor device obtained by a method according to the invention. Furthermore, the invention comprises an apparatus for performing a method according to the invention which is characterized in that the apparatus comprises a deposition reactor and is provided with a first source for a gaseous compound of silicon which is free of chlorine and a second source for a gaseous compound of silicon which comprises chlorine. Preferably the apparatus is provided with a first carrier gas source comprising an inert gas and a second carrier gas source comprising hydrogen and with means to switch the carrier gas from the inert gas to hydrogen during the deposition process.

Figure 2:
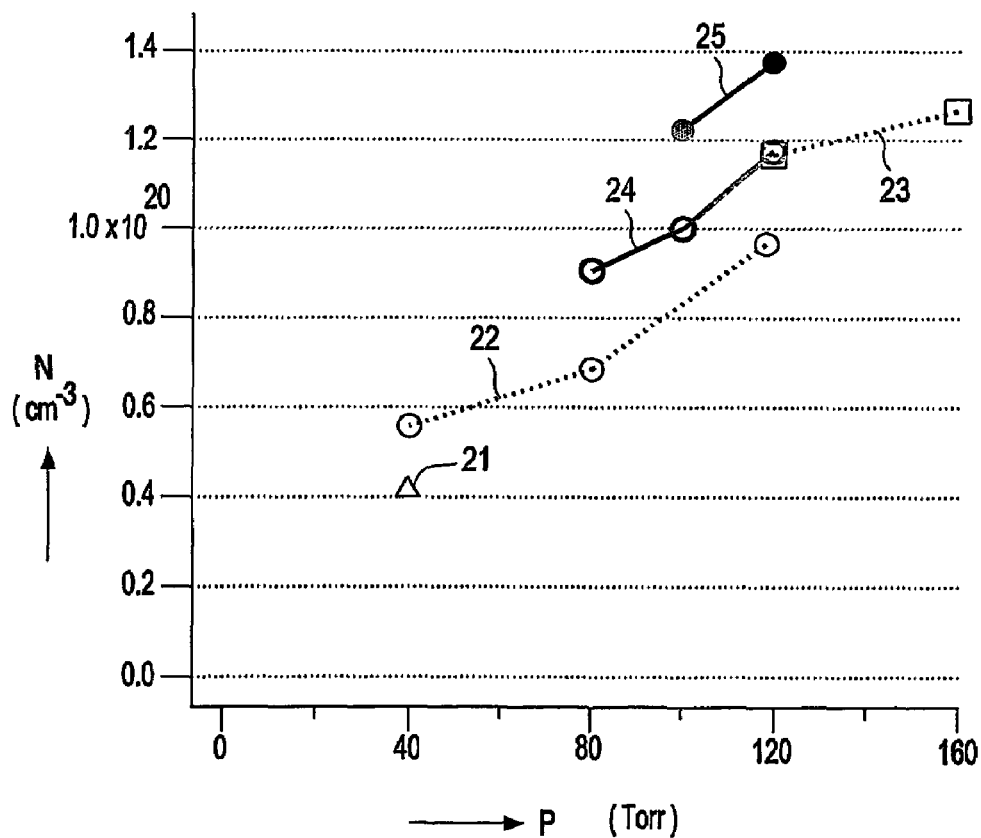
Figure 3:
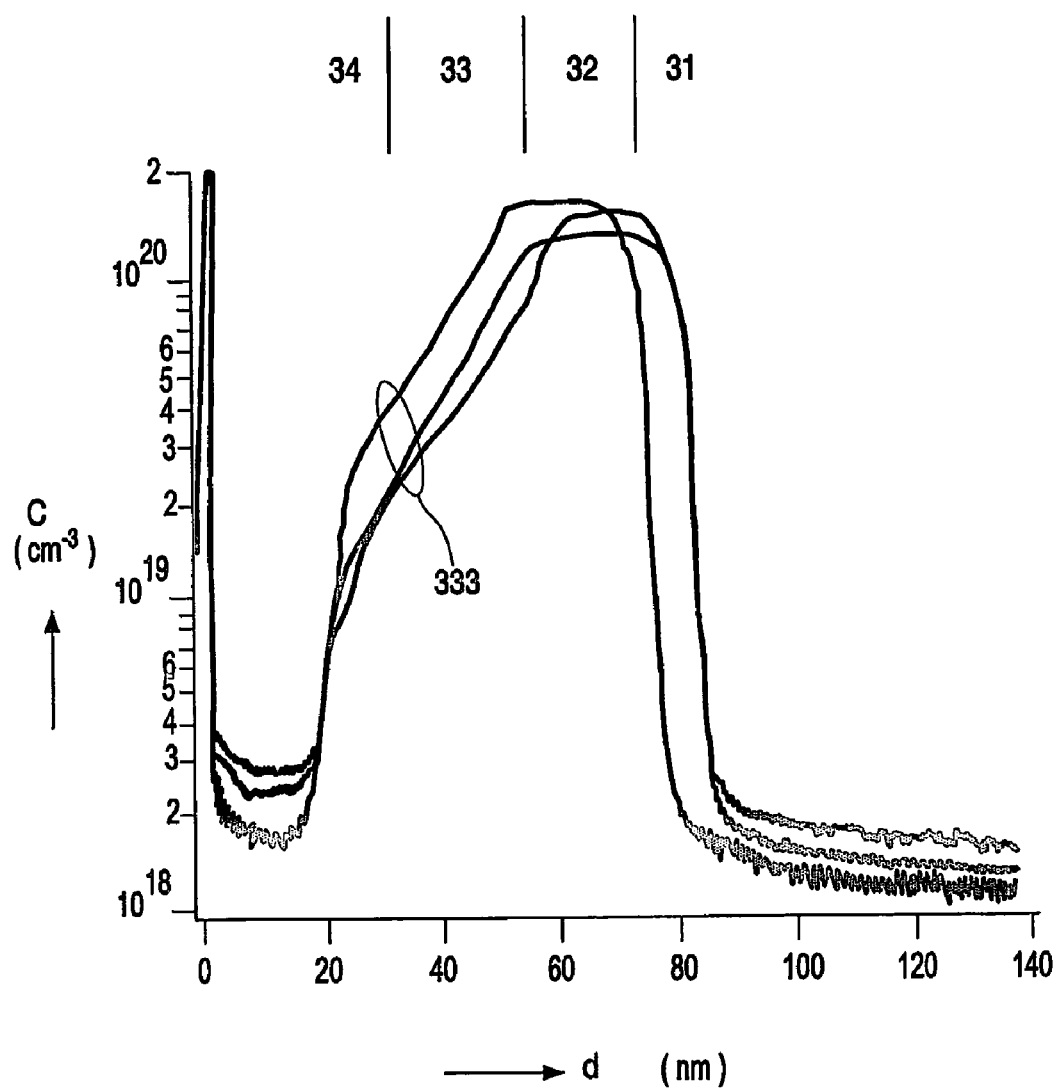
Figure 4:
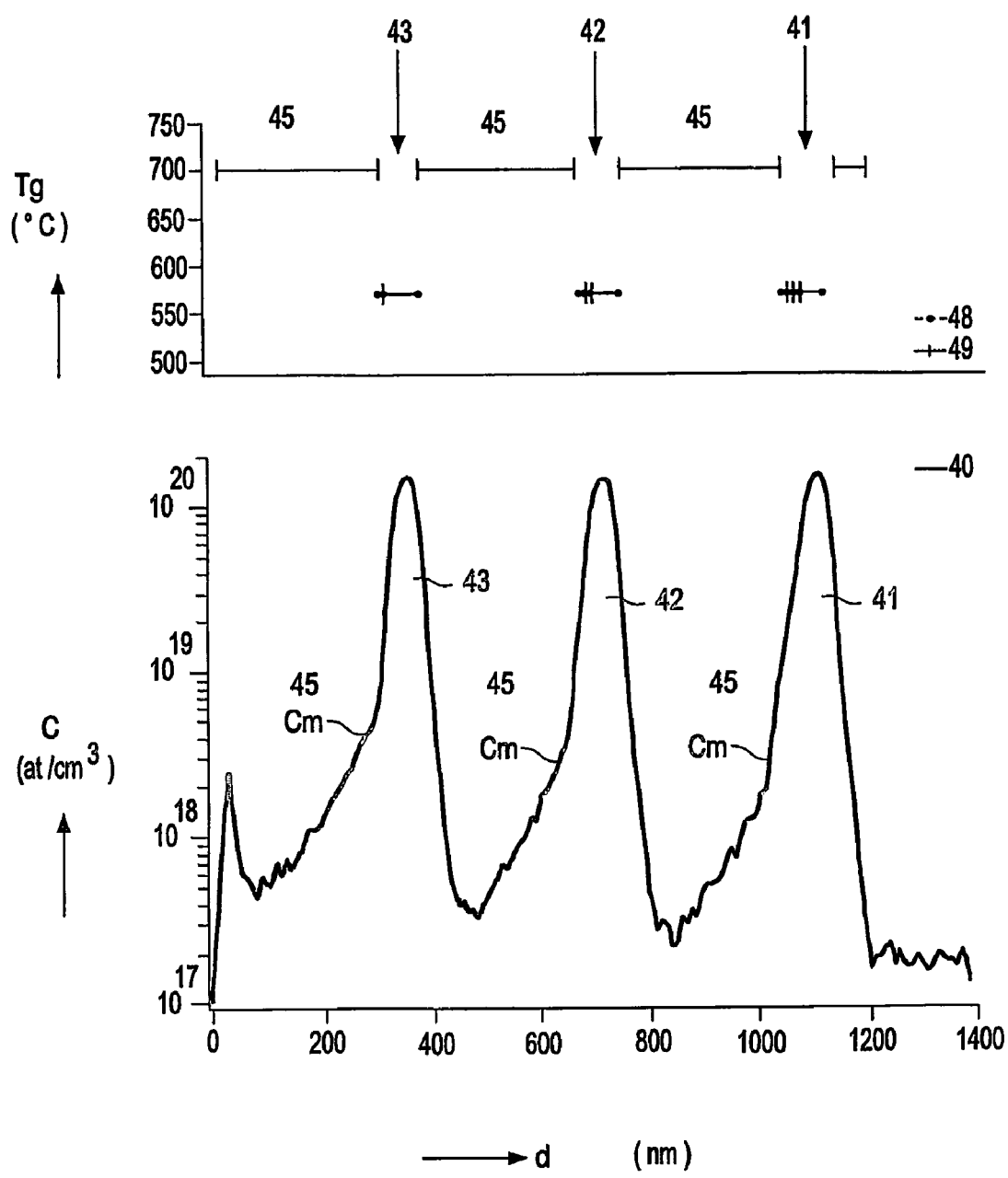
Figure 5:
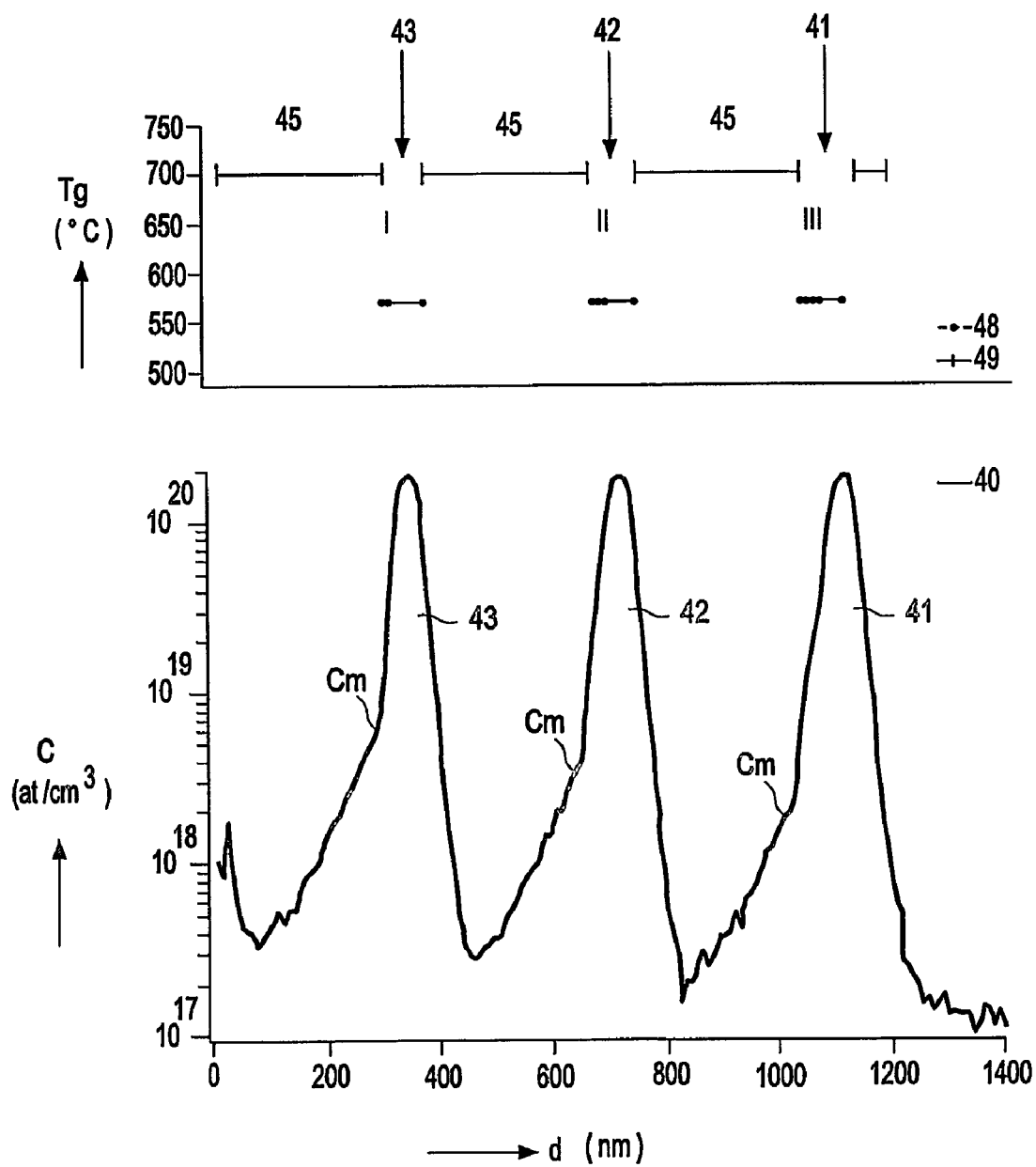
Figure 6:
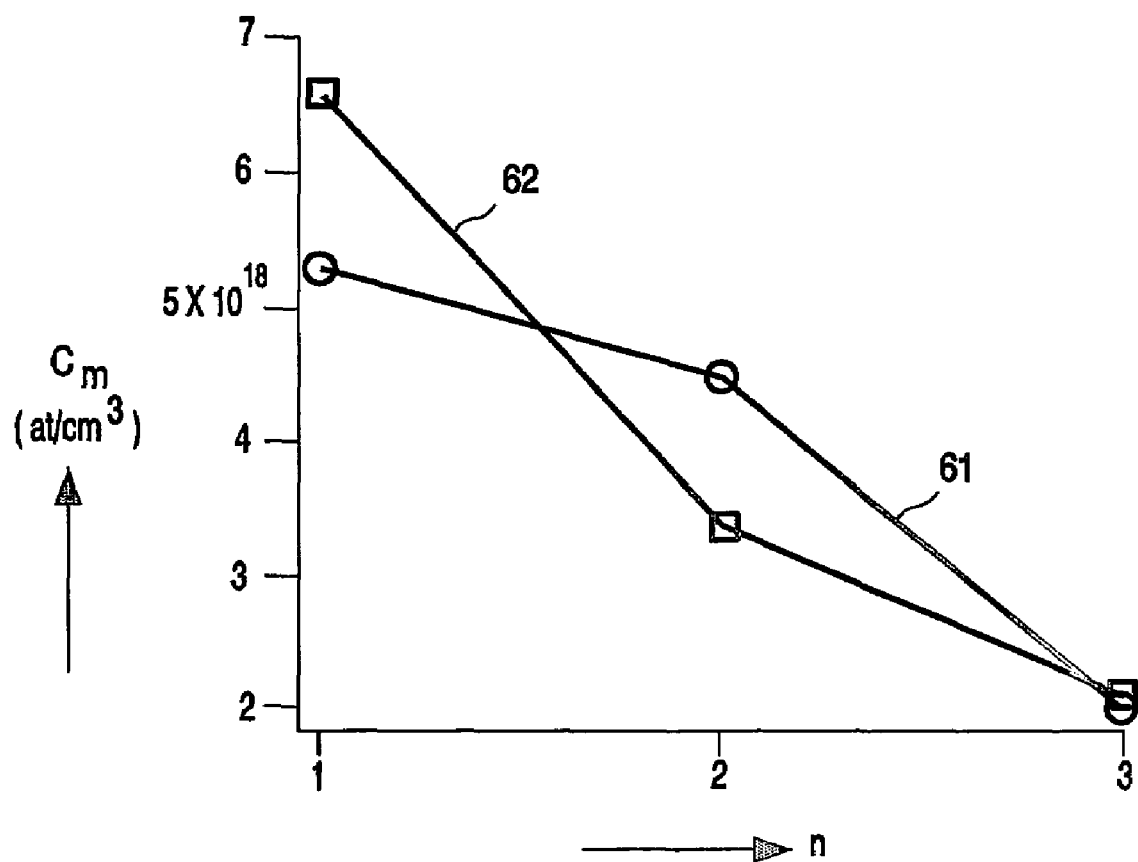
Figure 7:
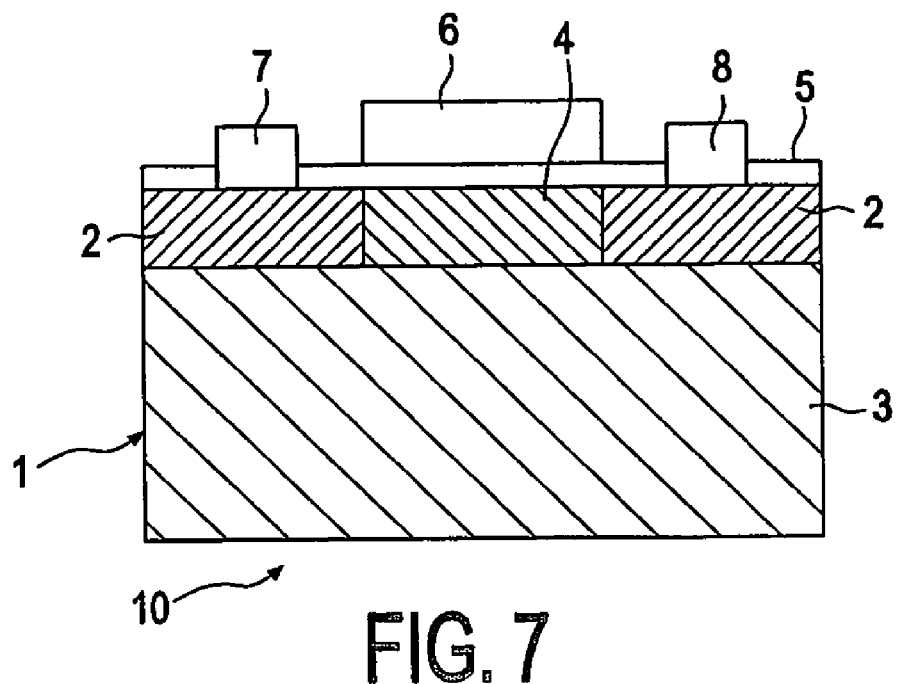
Figure 8:
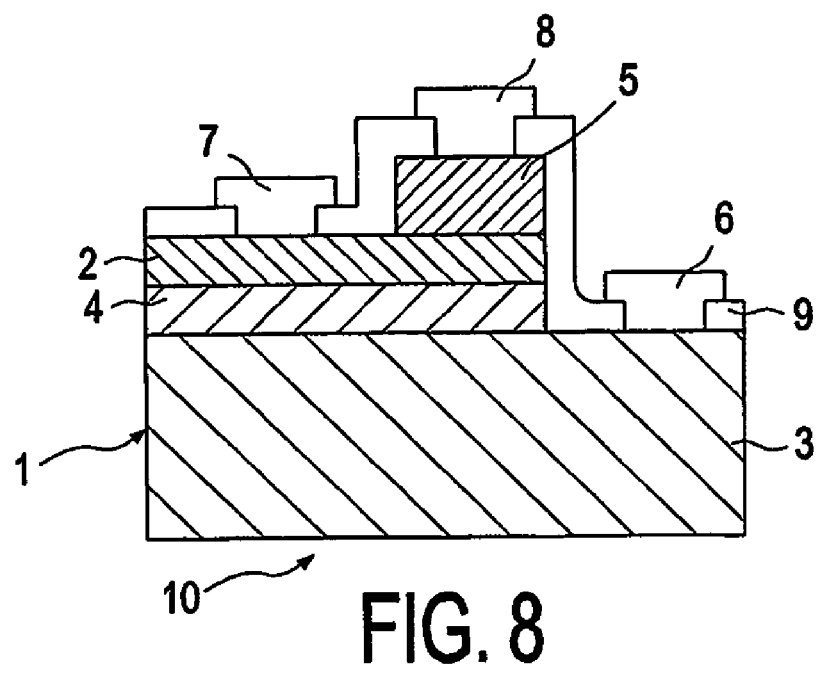

These and other aspects of the invention will be apparent from and elucidated with reference to the embodiments described hereinafter, to be read in conjunction with the drawing, in which:

FIG. 1 shows the growth rate of an in situ doped layer as a function of the total pressure for a method according to the invention and another method for comparison, FIG. 2 shows the carrier concentration of in situ doped layer as a function of the total pressure for a method according to the invention and another art method for comparison, FIG. 3 shows the concentration profile of dopant atoms in a layer structure grown with a method according to the invention in which the carrier gas is switched from nitrogen to hydrogen, FIGS. 4 and 5 show the concentration profile of dopant atoms in a layer structure in which a switch cycle from nitrogen to hydrogen is repeated, FIG. 6 shows the influence of the repetition of the switch cycle of FIGS. 4 and 5 on the shoulder concentration of a dopant profile, FIG. 7 shows a first example of a semiconductor device obtainable with a method according to the invention, and FIG. 8 shows a second example of a semiconductor device obtainable with a method according to the invention.

The Figs. are diagrammatic and not drawn to scale, the dimensions in the thickness direction being particularly exaggerated for greater clarity. Corresponding parts are generally given the same reference numerals and the same hatching in the various Figs.

FIG. 1 shows the growth rate (Vg) of an in situ doped layer as a function of the total pressure (P) for a method according to the invention and another method for comparison. The latter method comprises the use of a nitrogen ($N_2$) carrier gas at a flow of 15 slm, a silane flow of 200 sccm and a flow of 100 sccm of a mixture containing 0.1% phosphine in $H_2$. Data point 11 represents the growth rate (Vg) in nm/min at a temperature of 600° C., curve 12 connects data points at 575° C. and curve 13 connects data points at 550° C. The results represented by curve 14 were also obtained at 575° C. but the phosphine mixture flow was 200 sccm while the other flows are the same as mentioned above.

The data points connected by curve 15 represent results obtained with a method according to the invention in which a mixture of silane and dichlorosilane was used as the gas stream comprising a gaseous compound of silicon. The flow rate of silane was 200 sccm and the flow rate of dichlorosilane was 20 sccm. The carrier gas flow, the phosphine gas flow and the growth temperature were the same as for the results of curve 14. From FIG. 1 it is clear that a method according to the invention gives—for comparable conditions—a larger growth rate than a method in which only silane was used as the gaseous silicon compound.

FIG. 2 shows the carrier concentration (N) of in situ doped layer as a function of the total pressure ( ) for a method according to the invention and another method for comparison. The data points/symbols/curves correspond with those of FIG. 1 and are indicated in FIG. 2 by the reference numerals 21, 22, 23, 24 and 25. Again it is clear that—for comparable conditions—a method according to the invention (see curve 25) is superior in obtaining a very high carrier concentration.

FIG. 3 shows the concentration profile of dopant atoms (C) in a layer structure grown with a method according to the invention in which the carrier gas is switched from nitrogen to hydrogen. The, in this case phosphor, concentration C is given as a function of the depth d in a layer structure, comprising a first region 31 which corresponds to a p-type silicon substrate, a second region 32 in which a doped silicon layer is grown with nitrogen as carrier gas, a third region 33 in which an undoped silicon layer is grown with nitrogen as carrier gas and a fourth region in which an undoped layer is grown with hydrogen as carrier gas. The curves 333 were obtained with various growth conditions but show all a strong decrease of the phosphor concentration in the first undoped region 33 grown after growth of the doped region 32. Moreover, a very strong and moreover a very steep decrease of the phosphor concentration is observed in the second undoped region 34 which was grown using hydrogen as the carrier gas.

FIGS. 4 and 5 show the concentration profile of dopant atoms in a layer structure in which a switch cycle from nitrogen to hydrogen is repeated between the growth of a phosphor-doped layer and an undoped layer. Again the phosphor concentration C is given as a function of depth d in a grown layer structure, see curve 40. The upper part of the Figs. represent growth temperature Tg and the schedule of the gas flows which was followed. Symbol 48 corresponds with nitrogen as the carrier gas, whereas symbol 49 corresponds with hydrogen as the carrier gas. In each case three phosphor spikes 41, 42, 43 were grown each about 40 nm thick at growth temperature Tg of 575° C. and with nitrogen as the carrier gas. In between an undoped about 250 nm thick silicon region 45 was grown at 700° C. and with hydrogen as the carrier gas. In between growth of the spikes 41-43 and an undoped region 45, a cycle without doping was effected which comprised a short first period (e.g. 20 sec) of non-growth with nitrogen as the carrier gas, a second short period of non-growth with hydrogen as the carrier gas, and a third short period with small growth rate and (again) nitrogen as the carrier gas. After spike 43 this cycle was performed once, after spike 42 twice and after spike 41 three times. It is clear form curve 40 that the phosphor concentration at the shoulder Cm of the profile 40 is lower if the above cycle is repeated. Even a repetition of three times results in a still lower value of the concentration Cm. Thus it is again clear from these results that a short switch to hydrogen gas as the carrier gas after growth of a—phosphor—doped region results in a steeper reduction of the phosphor concentration in a non-phosphor doped region 45 grown on top of a phosphor doped region 41,42,43.

The above results are the same both for the data of FIG. 4 and FIG. 5. The only difference is that in FIG. 5 the growth temperature is maintained at 575° during each cycle, whereas in the experiment of FIG. 6, the (growth) temperature was increased to 650° during the non-growth period with hydrogen as the carrier gas.

FIG. 6 shows the influence of the repetition n of the switch cycle of FIGS. 4 and 5 on the shoulder concentration Cm of a dopant profile as already mentioned above. Curve 61 corresponds with the results of FIG. 4, while curve 62 corresponds with the results of FIG. 5. In each case it is again shown that repetition of the carrier gas switch cycle n-times with n−1, 2 or 3, results in an improvement of the steepness of a phosphor profile grown before the cycle.

FIG. 7 shows a first example of a semiconductor device obtainable with a method according to the invention. The device 10 comprises a MOSFET with a semiconductor body 1 with in this case a p-type silicon substrate 3 on top of which an n-type (phosphor) doped region 2 is grown (locally) at both sides of a p-type region 4. The regions 2 form the source and drain of the MOSFET whereas region 4 comprises the channel region which is below an insulating, e.g. silicondioxide, layer 5 on top of which the gate electrode 6 is present. Metal regions 7,8 form the connection conductors for the source and drain respectively. Thanks to the fact that the device 10, in particular the regions 2 thereof, are obtained with a method according to the invention, the source and drain regions of the MOSFET have a very high carrier concentration which has the advantage that contact resistance to the source and drain contacts are favorably low and at the same time the dopant profile is very steep thanks to the relatively low thermal budged of the method according to the invention. Note that the insulating layer 5 on top the source an drain will be in general another layer than the one present below the gate 6. This is different from what FIG. 7 suggests.

FIG. 8 shows a second example of a semiconductor device obtainable with a method according to the invention. The device 10 here comprises a bipolar transistor with a semiconductor body 1 again comprising a p-type silicon substrate 3 which forms a high doped collector region 3 of the transistor. On top thereof a layer structure comprising a relatively low doped p-type layer 4 is grown which forms a lower doped part of the collector. On top thereof a relatively high doped n-type (phosphor doped) silicon region 2 is grown which forms the base of the transistor and on top thereof a high doped p-type emitter layer 5 is grown. The structure is locally etched in such a way that regions 3,2 and 5 become available for provision with a contact metal, respectively metal 6,7,8 to collector, base and emitter of the transistor. The surface of the structure is passivated with an insulating layer 9. Thanks to the fact that the device 10, in particular the regions 2 thereof, are obtained with a method according to the invention, the transition between the base and the emitter of a bipolar transistor is very sharp, which has the advantage that the transistor may have a very good high frequency behavior, e.g. a very high cut off frequency.

In this case, if a very thin p-type emitter 5 is desired, the growth of the latter is preferably done at the same low growth temperature as at which the phosphor doped base layer 2 is grown. If a thicker emitter 5 is desired, the growth temperature may be increased before and during growth of the emitter layer 5.

It will be obvious that the invention is not limited to the examples described herein, and that within the scope of the invention many variations and modifications are possible to those skilled in the art.

For example, in stead of discrete MOSFET or bipolar transistor, a complete IC may be advantageously manufactured with a method according to the invention. In particular the method is suitable for the manufacture of BICMOS devices comprising both npn and pnp bipolar transistors.

Although the problems solved with the invention are most prominent phosphor as a n-type dopant, similar beneficial effects of the invention are likely for other V-element dopants like As and Sb. In stead of silane also disilane ($Si_2H_6$) or the like may be used, in stead of DCS other chlorine containing gaseous silicon compounds like tri ($SiHCl_3$) or tetrachlorosilane ($SiC_4$) may be used.

It is further noted that although nitrogen does give good results and is very attractive as an inert carrier gas because it is cheap and easy to handle, similar results are expected with inert gasses comprising e.g. a noble gas like helium or argon.

Finally it is noted that also carbon may be added to a silicon or silicon-germanium region.

The invention claimed is:

1. Method of manufacturing a semiconductor device with a semiconductor body comprising
   silicon provided with an n-type doped semiconductor region comprising silicon formed by an epitaxial deposition process, wherein
   the epitaxial deposition process of the n-type region is performed by positioning the semiconductor body in an epitaxial reactor and
   introducing in the reactor a first gas stream comprising a carrier gas and further gas streams comprising a gaseous compound comprising silicon and a gaseous compound comprising an element from the fifth column of the periodic system of elements, while heating the semiconductor body to a growth temperature (Tg) and using an inert gas as the carrier gas, characterized in that for the gaseous compound comprising silicon a mixture is chosen of a first gaseous silicon compound which is free of chlorine and a second gaseous silicon compound comprising chlorine.

2. Method according to claim 1, characterized in that the first gaseous silicon compound silane is chosen and for the second gaseous silicon compound dichlorosilane is chosen.

3. Method according to claim 1, characterized in that for the gaseous compound comprising a V-element, phosphine is chosen.

4. Method according to claim 1, characterized in that for the growth temperature (Tg) a temperature in the range between 500° C. and 600° C. is chosen.

5. Method according to claim 1, characterized in that the epitaxial deposition process is performed at reduced pressure (P).

6. Method according to claim 5, characterized in that a pressure (P) is chosen between 120 and 160 Torr.

7. Method according to claim 1, characterized in that for the semiconductor device a MOSFET device is chosen and the semiconductor region is formed as a source or drain of the MOSFET device.

8. Method according to claim 1, characterized in that nitrogen is chosen as the inert gas.

9. Method according to claim 1, characterized in that the semiconductor region or the further semiconductor region are formed as a mixed crystal of silicon and germanium by leading a yet another gas stream to the reactor comprising a gaseous compound of germanium.

10. Semiconductor device (10) obtained by the method as recited in claim 1.

11. Apparatus for performing a method according to claim 1, characterized in that the apparatus comprises a deposition reactor and is provided with a first source for a gaseous compound of silicon which is free of chlorine and a second source for a gaseous compound of silicon which comprises chlorine.

12. Apparatus according to claim 11, characterized in that it is provided with a first carrier gas source comprising an inert gas and a second carrier gas source comprising hydrogen and with means to switch the carrier gas from the inert gas to hydrogen during the deposition process.

13. The method of claim 1, further comprising:
after growth of the n-type doped semiconductor region, maintaining the introduction of the first gas stream in the reactor for a first time period of a cycle,
during a second time period of the cycle, replacing the inert carrier gas of the first gas stream with hydrogen gas; and
during a third time period of the cycle, switching the carrier gas of the first gas stream from the hydrogen gas back to the inert gas.

14. The method of claim 13, further comprising:
repeating the three time periods of the cycle at least three times; and
after repeating the cycle at least three times, growing a further semiconductor region on top of the n-type doped semiconductor region.

15. The method of claim 14, further comprising:
maintaining the growth temperature at about 575° C. during the growth of the n-type doped semiconductor region and during the first and third time periods of the cycle;
increasing the growth temperature to about 650° C. during the second time period of the cycle; and
increasing the growth temperature to about 700° C. during the growth of the further semiconductor region.

16. Method of manufacturing a semiconductor device with a semiconductor body comprising
silicon provided with an n-type doped semiconductor region comprising silicon formed by an epitaxial deposition process, wherein
the epitaxial deposition process of the n-type region is performed by positioning the semiconductor body in an epitaxial reactor and
introducing in the reactor a first gas stream comprising a carrier gas and further gas streams comprising a gaseous compound comprising silicon and a gaseous compound comprising an element from the fifth column of the periodic system of elements, while heating the semiconductor body to a growth temperature and using an inert gas as the carrier gas, characterized in that for the gaseous compound comprising silicon a mixture is chosen of a first gaseous silicon compound which is free of chlorine and a second gaseous silicon compound comprising chlorine,
characterized in that the after the growth of the n-type semiconductor region comprising silicon the deposition process is continued with the growth of a further semiconductor region comprising a lower n-type doping than the semiconductor region or comprising a p-type doping and in that at least between the growth of the semiconductor region and the growth of the further semiconductor region, the inert carrier gas is replaced by a carrier gas comprising hydrogen.

17. Method according to claim 16, characterized in that after growth of the semiconductor region, the carrier gas of an inert gas is maintained in a first short period of a cycle of three short periods, the carrier gas is replaced by hydrogen during the second short period and the carrier gas is switched back to the inert gas during the third short period in which the deposition process is continued but without the presence of the gaseous compound of the V-element.

18. Method according to claim 17, characterized in that the cycle of three periods is repeated a number of times.

19. Method according to claim 16, characterized in that during the deposition of the further semiconductor region, the gas stream of the gaseous compound with the V-element is chosen to be zero and replaced by another gas stream comprising a gaseous compound comprising an element of the third column of the periodic system of the elements, resulting in a device comprising a p-type further semiconductor region on top of the n-type semiconductor region.

20. Method according to claim 19, characterized in that for the semiconductor device a pnp bipolar transistor is chosen of which the n-type base region is formed by the n-type semiconductor region and the p-type emitter regions is formed by the further semiconductor region.

* * * * *